United States Patent [19]
Reddy et al.

[11] Patent Number: 5,942,914
[45] Date of Patent: Aug. 24, 1999

[54] PLD WITH SPLIT MULTIPLEXED INPUTS FROM GLOBAL CONDUCTORS

[75] Inventors: Srinivas Reddy, Fremont; Christopher Lane, Campbell, both of Calif.

[73] Assignee: Altera Corporation, San Jose, Calif.

[21] Appl. No.: 08/879,309

[22] Filed: Jun. 19, 1997

Related U.S. Application Data

[60] Provisional application No. 60/029,313, Oct. 25, 1996.

[51] Int. Cl.$^6$ .................................................. H03K 19/177
[52] U.S. Cl. .................................................. 326/41; 329/39
[58] Field of Search .......................................... 326/37–41

[56] References Cited

U.S. PATENT DOCUMENTS

| | | | |
|---|---|---|---|
| 4,609,986 | 9/1986 | Hartmann et al. | 364/200 |
| 4,617,479 | 10/1986 | Hartmann et al. . | |
| 4,642,487 | 2/1987 | Carter . | |
| 4,677,318 | 6/1987 | Veenstra . | |
| 4,713,792 | 12/1987 | Hartmann et al. | 364/900 |
| 4,871,930 | 10/1989 | Wong et al. . | |
| 4,899,067 | 2/1990 | So et al. . | |
| 4,912,342 | 3/1990 | Wong et al. . | |
| 5,121,006 | 6/1992 | Pedersen . | |
| 5,241,224 | 8/1993 | Pedersen et al. . | |
| 5,260,610 | 11/1993 | Pedersen et al. . | |
| 5,260,611 | 11/1993 | Cliff et al. . | |
| 5,268,598 | 12/1993 | Pedersen et al. . | |
| 5,309,046 | 5/1994 | Steele . | |
| 5,350,954 | 9/1994 | Patel . | |
| 5,352,940 | 10/1994 | Watson . | |
| 5,359,242 | 10/1994 | Veenstra . | |
| 5,444,394 | 8/1995 | Watson . | |
| B1 4,617,479 | 9/1993 | Hartmann et al. . | |

OTHER PUBLICATIONS

Altera Corp., "Flex 8000 Programmable Logic Device Family" data sheet, Aug. 1994, ver. 4.

Altera Corp., "Max 5000/EPS464 Programmable Logic Device Family" data sheet, Aug. 1993, ver. 1.

Xilinx Corp., "XC4000, XC4000A, XC4000H Logic Cell Array Families" data sheet.

*Primary Examiner*—Jon Santamauro
*Assistant Examiner*—Don Phu Le
*Attorney, Agent, or Firm*—Townsend and Townsend and Crew LLP

[57] ABSTRACT

An improved multiplexer arrangement for connecting global conductors to logic array block (LAB) inputs. A single connection connects a particular global conductor to an input path to LABs on both sides of the interconnect region in a folded LAB architecture. The number of connections to the global conductors is thus reduced, reducing the number of transistors needed to make those connections and the corresponding loading of the global conductors. The connections to two paths are part of a first level multiplexer. A second-level multiplexer connected to each LAB line is also provided to add back some of the flexibility lost by having each global conductor connection connect to two paths. The invention cuts the number of transistors needed to connect to the global conductors in half, while adding some transistors for the second-level multiplexers, with a net reduction in connection transistors of about ⅓.

26 Claims, 7 Drawing Sheets

PLD WITH SPLIT MULTIPLEXED INPUTS FROM GLOBAL CONDUCTORS

This application claims benefit of Provisional application 60/029,313 filed Oct. 25, 1996.

BACKGROUND OF THE INVENTION

This invention relates to programmable logic array (PLA) integrated circuits, and more particularly to a PLA integrated circuit that uses a multiplexer interconnect architecture.

As shown by commonly-assigned U.S. Pat. No. 4,871,930 (Wong), which is hereby incorporated by reference in its entirety, and the references cited therein, programmable logic devices (PLDs) are well known integrated circuits. As described in Wong, a major obstacle in increasing the logic density in previously known PLDs was the size of the single global interconnection array which increased as the square of the number of output functions. This obstacle was overcome to a large extent by the use of a programmable interconnect array (PIA) disclosed in Wong. In a PLD using a PIA, a single global interconnection array using erasable programmable read-only memory (EPROM) cells was used to route signals to and from logic array blocks (LABS) which contained logic elements, logic modules, and a local interconnection array.

The architecture using PIAs and LABs disclosed in Wong produced a generation of successful PLDs available commercially from Altera Corporation of San Jose, Calif. Yet, to meet ever increasing technological demands, PLDs have been constantly increasing in both size and complexity. In particular, to achieve higher logic density, more logic elements have been incorporated into PLDs and this has necessitated increasing the size of the PIA. However, a significant amount of the power used in PLDs is consumed in the programmable elements of the PIA, and a speed limitation is capacitive loading in the programmable elements of the PIA. Increasing the size of the PIA, therefore, leads undesirably to higher power consumption and reduction in speed.

An enhancement to the PIA was disclosed in a commonly-assigned U.S. Pat. No. 5,241,224, that successfully addressed the above problems associated with increased chip density. It was realized that, as the complexity of PLDs increases, the increase in the number of programmable elements in the PIA is responsible for a significant increase in the amount of the power consumed, and is responsible for a significant decrease in the speed due to the capacitive loading of EPROM cells. Furthermore, it was observed that only a small fraction of the total number of EPROM cells in the PIA is used, so that most of the increased capacitive loading and power consumption is unnecessary.

Accordingly, in the enhanced PIA architecture, the programmable elements and thus their associated power consumption and capacitive loading were eliminated by an alternative global interconnect array (GIA) architecture. In the GIA, selected global conductors are connected to the inputs of a group of multiplexers in a predetermined pattern, and the outputs of the multiplexers are connected to the inputs of logic modules in the LABS. Programmability through the use of a global EPROM in the PIA of the prior PLDs is replaced by programmability of the multiplexers connected to the GIA. The multiplexers are controlled by an array of programmable architecture bits so that the signals on selected global conductors can be routed to the inputs of selected logic modules.

Commonly assigned U.S. Pat. No. 5,444,391 discloses a PLD circuit which combines the high performance global interconnect array (GIA) architecture with logic array blocks (LABs) that use zero-power CMOS logic modules. The CMOS logic module includes a multi-input look-up table and a flip-flop type device for implementing the logic. The GIA employs a very fast multiplexer-based interconnect network to carry all signals that must span across LAB boundaries, as well as all input signals into the device.

Commonly assigned U.S. patent application Ser. No. 60/028,206 shows an architecture using "folded rows." A row of LABs is folded back along a second side of an interconnect region, giving LABs on both sides of the interconnect region. Connecting lines thus extend in both directions from the global conductors in the interconnect region to the LABs. This architecture allows for a higher density of logic, and provides logic regions with more uniform horizontal and vertical characteristics. However, an increased number of connections are required in the interconnect region, requiring more transistor switches in this region, impacting the interconnect region layout and loading the global conductors.

SUMMARY OF THE INVENTION

The present invention provides an improved multiplexer arrangement for connecting global conductors to LAB inputs. A single connection connects a particular global conductor to an input path to LABs on both sides of the interconnect region in a folded LAB architecture. The number of connections to the global conductors is thus reduced, reducing the number of transistors needed to make those connections and the corresponding loading of the global conductors. The connections to two paths are part of a first level multiplexer. A second-level multiplexer connected to each LAB line is also provided to add back some of the flexibility lost by having each global conductor connection connect to two paths. The invention cuts the number of transistors needed to connect to the global conductors in half, while adding some transistors for the second-level multiplexers, with a net reduction in connection transistors of about ⅓.

Flexibility is maintained by providing a second-level multiplexer for each LAB input, thus giving N second-level multiplexers for N LAB inputs, and by setting the width of first level multiplexers to have a number of inputs equal to $(M*K)/(N*S)$. M is the number of global conductors, N is the number of LAB lines entering a single LAB, S is the number of inputs into each second-level multiplexer (the number of ways each first level multiplexer is split), and K is the number ways into a LAB from a given global conductor.

The invention provides a trade off between the flexibility of the connections and the number of transistors needed. The inventors have determined that by allowing each global conductor to get to two of the LAB lines, blockage of connections is kept to a manageable level and the run time of software assigning the connections is reduced.

In one embodiment, there are M global conductors, and N inputs to each LAB, with K=2 and S=2, giving an M/N input multiplexer. In another alternate embodiment, with K=2 and S=4, a multiplexer with $M/(N\times 2)$ inputs is used. In yet another embodiment, a single connecting line from each global conductor is connected to two multiplexers on each side of the global conductor channel, or four multiplexers in all, to provide access to one of four LAB lines.

For a further understanding of the nature and advantages of the invention, reference should be made to the following description taken in conjunction with the accompanying drawings.

DETAILED DESCRIPTION OF THE PREFERRED EMBODIMENTS

A. Overall Architecture

Figure 1:
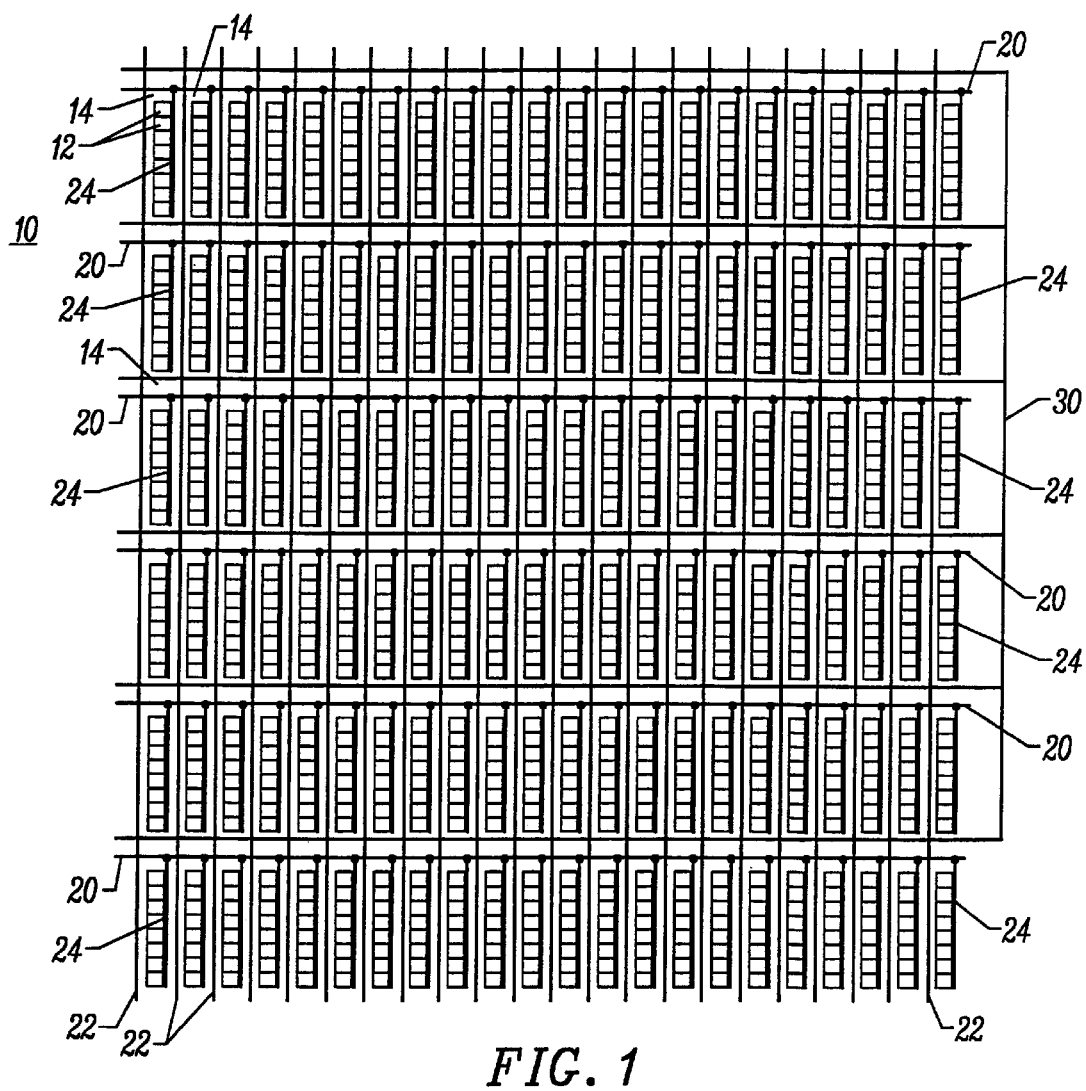
FIG. 1 is a simplified schematic block diagram of a programmable logic device using the present invention.

FIG. 1 shows the overall organization of an illustrative programmable logic array integrated circuit 10 constructed in accordance with the principles of this invention. Not all of the conductors employed in circuit 10 are shown in FIG. 1, but enough is shown in this Fig. to begin the discussion. Each logic module 12 is represented by a small square in FIG. 1. Logic modules 12 are grouped together in groups of eight. Each of these groups is referred to as a logic array block or LAB 14. LABs 14 are arranged in six horizontal rows and 22 vertical columns on circuit 10. Accordingly, there are a total of 132 LABs 14 and 1056 logic modules 12 on circuit 10. Each logic module 12 is capable of performing a relatively elementary logic function (discussed in more detail below), but extremely complex logic can be performed by variously interconnecting the logic modules as will now be discussed.

The interconnection circuitry shown in FIG. 1 includes (1) groups of so-called global horizontal conductors 20 interspersed between the horizontal rows of LABs, and (2) groups of global vertical conductors 22 interspersed between the vertical columns of LABs. These conductors are global in the sense that they extend along an entire row or column. Programmable interconnections can be made between intersecting horizontal and vertical conductors in order to apply signals on the vertical conductors to the horizontal conductors. Each LAB 14 has a group of vertical LAB input conductors 24 for conveying signals from the global horizontal conductors 20 intersected by conductors 24 to the logic modules 12 in that LAB.

In addition to the above-described conductors, FIG. 1 shows part of a network of so-called universal fast conductors. The conductors 30 of this network shown in FIG. 1 extend throughout the entire circuit and can be used to convey widely used logic signals such as clock and/or clear signals to any logic modules 12 on the circuit.

Although other numbers of conductors can be used if desired, in the depicted preferred embodiment, there are 176 conductors in each group of global horizontal conductors 20, there are 16 conductors in each group of global vertical conductors 22, there are 24 conductors in each group of LAB input conductors 24, and there are four universal fast conductors 30.

B. Logic Array Blocks

Figure 2:
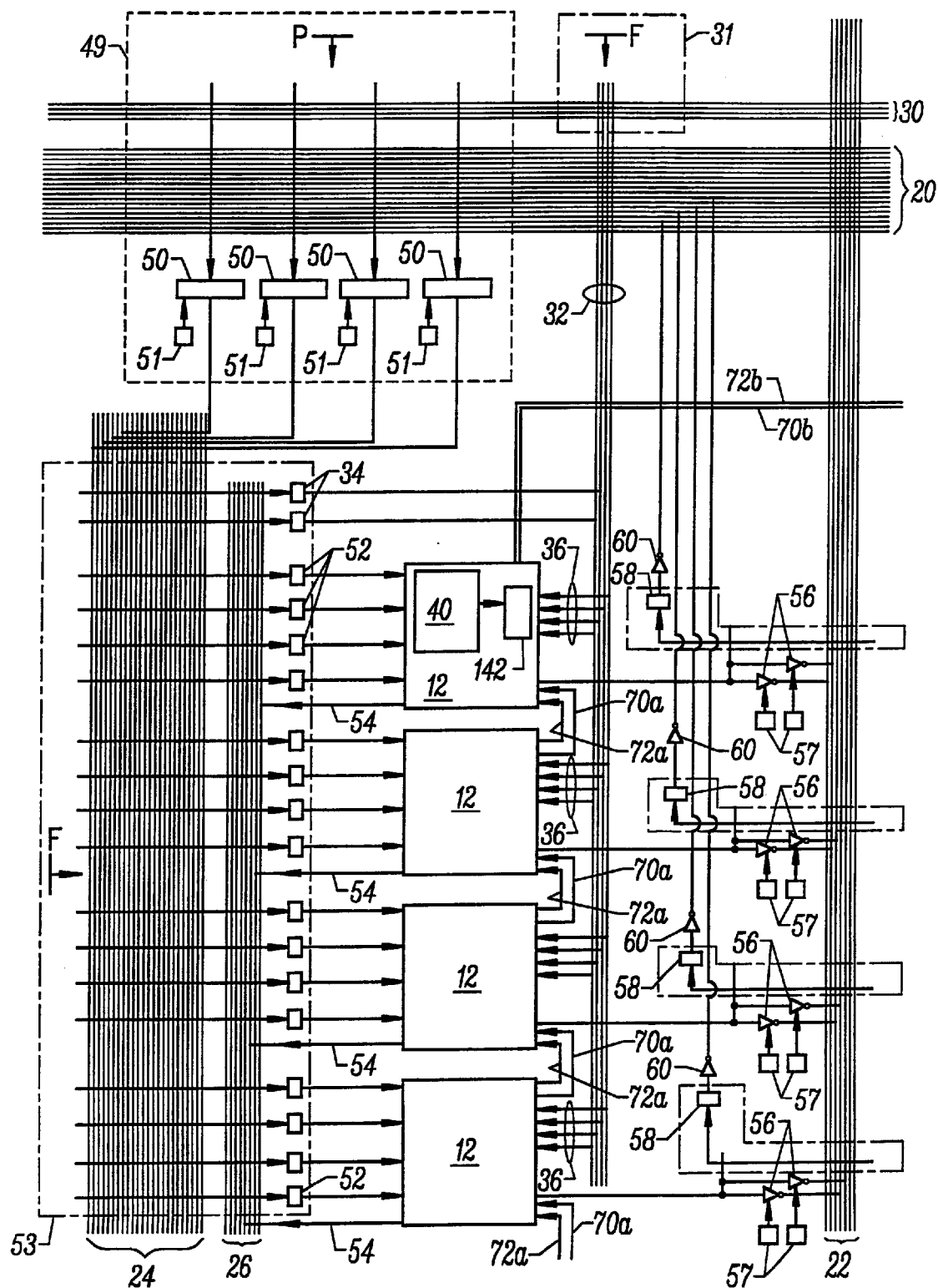
FIG. 2 is a simplified block diagram of a portion of the device of FIG. 1.

Turning now to FIG. 2 which shows one possible implementation of part of a typical LAB 14 on circuit 10 four representative logic modules 12 are shown. Although logic modules 12 can be implemented in other ways (e.g., as product-term-based macrocells) in the illustrative embodiment shown in FIG. 2 each logic module 12 includes a look up table or universal logic block ("ULB") 40 and a flip-flop type device 142. Each look up table 40 is basically a circuit which can be programmed to produce an output signal which is any logical function of four input signals applied to the look up table. Each flip-flop 142 is a circuit which can be programmed either to store or to simply pass through the output signal of the associated look up table (see, for example, the circuit shown in Norman et al. U.S. Pat. No. 4,864,161). Alternatively, device 142 could be a flip-flop with no pass through or bypass capability.

In addition to the above-described representative logic modules, FIG. 2 shows portions of representative global horizontal conductors 20, global vertical conductors 22, LAB input conductors 24, and universal fast conductors 30. Each of LAB input conductors 24 can be connected to a selected one (or more) of conductors 20 and 30 via a programmably controlled programmable logic connector ("PLC") 50 (only two of which are shown in FIG. 2). PLCs 50 can be implemented in any of a wide variety of ways. For example, each PLC 50 can be a relatively simple programmable connector such as a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic implementing functions such as AND, NAND, OR, or NOR. Examples of components suitable for implementing PLCs 50 are EPROMs, EEPROMs, pass transistors, transmission gates, antifuses, laser fuses, metal optional links, etc. The components of PLCs 50 can be controlled by various function control elements ("FCEs") (although with certain PLC implementations (e.g., fuses and metal optional links) separate FCE devices are not required, so that in those cases the depiction of FCE devices in the accompanying drawings merely indicates that the PLCs are programmable).

An exemplary embodiment of logic modules 260 as used in the present invention is described fully in commonly assigned U.S. Pat. Nos. 5,260,611 and 5,444,394.

C. Folded Rows

The present invention uses programmable logic array integrated circuit devices having a plurality of super-regions of programmable logic disposed on the device in a two-dimensional array of intersecting rows and columns of super-regions. Each super-region includes a plurality of regions of programmable logic and a plurality of inter-region interconnection conductors for conveying signals to and between the regions in that super-region. In some embodiments each super-region may be somewhat like a short, folded row of LABs. For example, in these embodiments the regions in each super-region may be disposed along both sides of that super-region's inter-region interconnection conductors. Thus in these embodiments a super-region may be viewed as a row of regions that is folded back along the associated inter-region interconnection conductors. Each region preferably includes a plurality of subre-gions of programmable logic. A typical subregion is programmable to perform any of several logical operations on a plurality of input signals applied to the subregion to produce an output signal of the subregion. Programmable logic connectors are associated with the regions for selectively bringing signals from the associated inter-region conductors into the region for use as inputs to the subregions in that region. Other programmable logic connectors selectively apply the subregion output signals to the associated inter-region conductors.

A plurality of horizontal inter-super-region interconnection conductors is associated with each row of super-regions for selectively conveying signals to, from, and between the super-regions in the associated row. Similarly, a plurality of vertical inter-super-region interconnection conductors is associated with each column of super-regions for selectively conveying signals to, from, and between the super-regions in the associated column.

Figure 3:
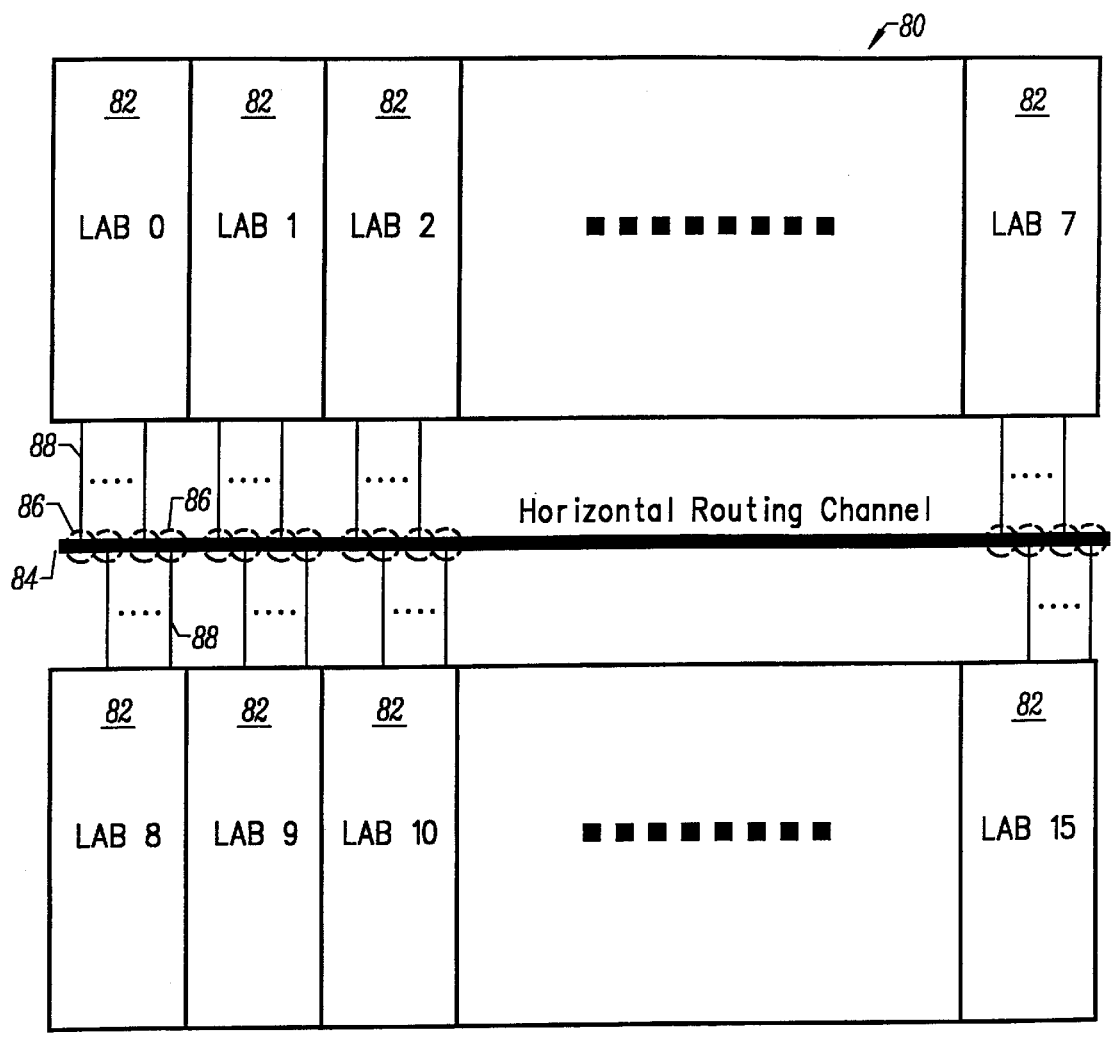
FIG. 3 is a block diagram of folded rows of logic array blocks used in the present invention.

An illustrative embodiment of a representative super-region 80 is shown in more detail in FIG. 3. In the FIG. 3 embodiment, super-region 80 includes two rows of regions 82 (LABs in the embodiment shown) of programmable logic disposed on respective opposite sides of a plurality of horizontal inter-region interconnection global conductors 84. For example, super-region 80 may include eight regions 82 on each side of conductors 84. This embodiment of super-region 80 is therefore somewhat like a row of 16 regions (LABs) 82 that has been folded in half, back on itself, with the associated interconnection conductors 84 between the two halves of the row. A series of multiplexers 86 provide connections to LAB input lines 88 to LABs 82.

D. Digital System

Figure 4:
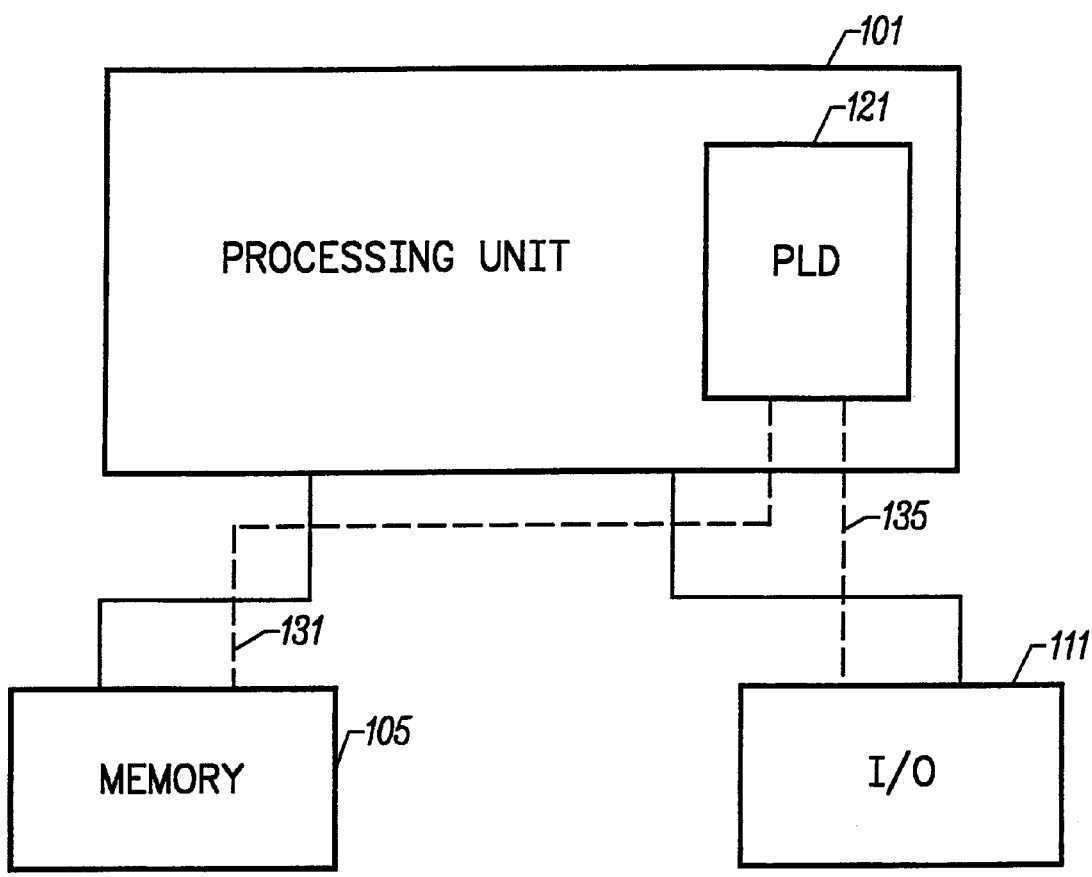
FIG. 4 is a block diagram of a system incorporating a PLD according to the present invention.

FIG. 4 shows a block diagram of a digital system within which the present invention may be embodied. In the particular embodiment of FIG. 4, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 121, or a combination of a general purpose computer and auxiliary special purpose hardware.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system.

In some embodiments, processing unit 101 may even be a computer system. In one embodiment, source code may be stored in memory 105, compiled into machine language, and executed by processing unit 101. Processing unit 101 need not contain a CPU and in one embodiment, instructions may be executed by one or more PLDs 121. Instead of storing source code in memory 105, only the machine language representation of the source code, without the source code, may be stored in memory 105 for execution by processing unit 101. Memory 105 may be a random access memory (RAM), read only memory (ROM), fixed or flexible disk media, PC Card flash disk memory, tape, or any other storage retrieval means, or any combination of these storage retrieval means.

Processing unit 101 uses I/O 111 to provide an input and output path for user interaction. For example, a user may input logical functions to be programmed into programmable logic device 121. I/O 111 may be a keyboard, mouse, track ball, digitizing tablet, text or graphical display, touch screen, pen tablet, printer, or other input or output means, or any combination of these means. In one embodiment, I/O 111 includes a printer used for printing a hard copy of any processing unit 101 output. In particular, using I/O 111, a user may print a copy of a document prepared using a word processing program executed using processing unit 101. In other cases, a user may print out a copy of the source code or a listing of the logical functions contained within PLD 121.

PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

E. Multiplexer Connections

Figure 5:
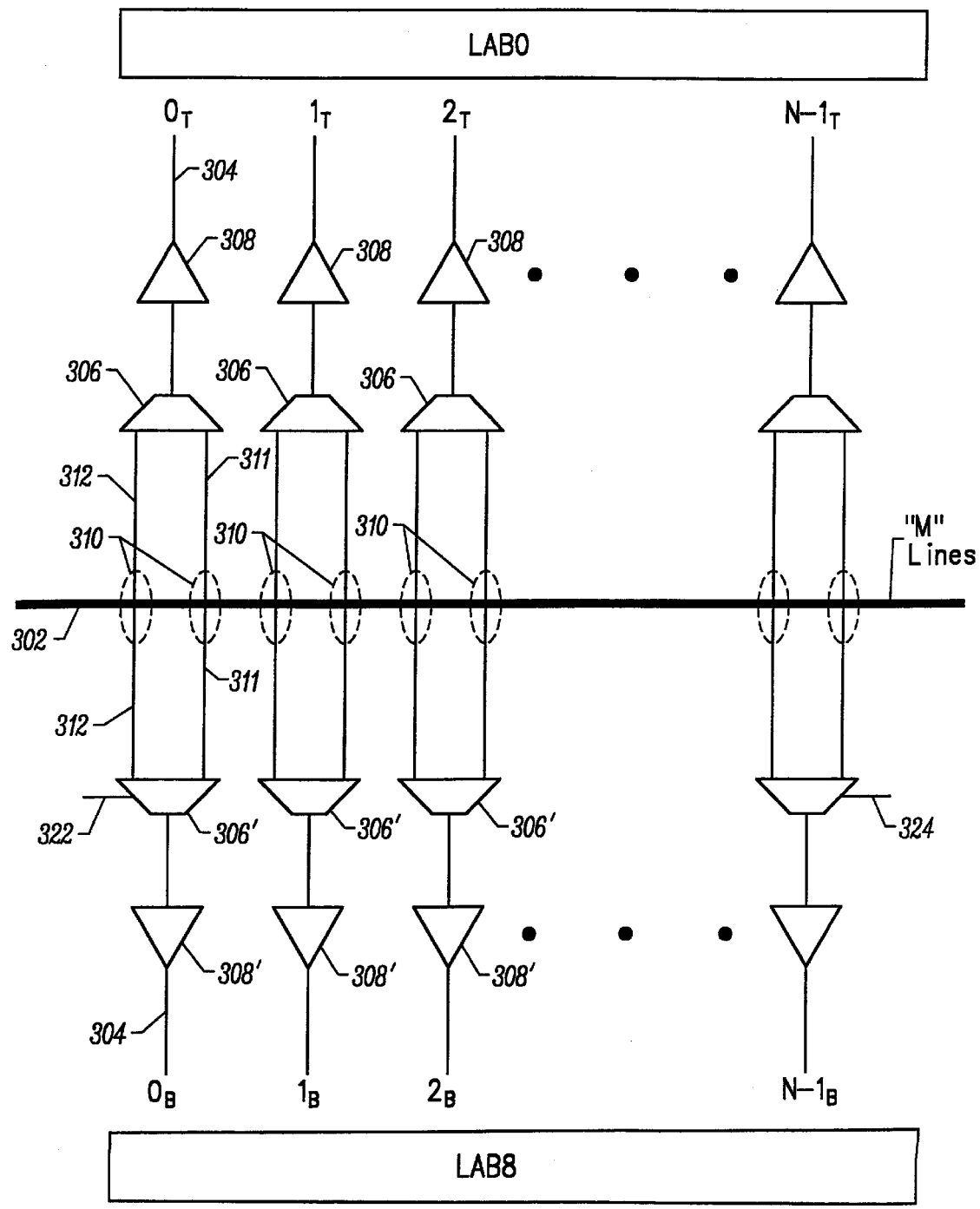
FIG. 5 is a diagram of a first embodiment of the multiplexer connections of the present invention.

FIG. 5 shows M global conductor lines 302 which are in turn respectively connected to one of N inputs 304 ($0_T$—$(N-1)_T$ to a single LAB (LAB 0). Global conductors 302 are also connected to another LAB (LAB 8) on the other side of the global conductor channel by inputs $0_B$—$(N-1)_B$. The connections are provided through multiplexers 310, 306 and buffers 308 on the top, and multiplexers 310, 306' and buffers 308' on the bottom. Dotted lines 310 illustrate multiplexers implemented as programmed connections of particular global conductors to multiplexer 306 inputs, such as line 312. Line 312 is the output of multiplexer 310, and is connected to a desired one of a subset of global conductors 302 connected to the input of multiplexer 310.

Line 312 is connected by a single connection from one of the global conductors 302 to an input of each of multiplexers 306 and 3061. Thus, instead of two connections, only a single connection is required, at the expense of requiring the same input to go to both LABs.

In the embodiment of FIG. 5, the inventors have found that sufficient flexibility is maintained by providing a multiplexer 306 for each LAB input, thus giving N multiplexers 306 for N LAB inputs, and by setting the width of the multiplexers 310 to have a number of inputs equal to (M*K)/(N*S). M is the number of global conductors, N is the number of LAB lines entering a single LAB, S is the number of inputs into each second-level multiplexer 306, 306' (in other words, S is the number of ways each first level multiplexer is split—this is 2 in FIG. 5 because 2 multiplexers 310 feed multiplexers 306, 306'), and K is the number ways into a LAB from a given global conductor. K isn't shown in FIG. 5, but preferably each global conductor 302 connects to 2 different multiplexers 310 to give K=2. The multiplexers 310 are not connected to the same second-level multiplexer 306, but rather 2 different second-level multiplexers.

For an example, assume the number of global conductors, M, is 100, and the number of LAB lines into each LAB is 20. Also assume that a conductor can connect to two different LAB lines, so K=2. For the example of FIG. 3, each multiplexer 86 has a number of inputs equal to (K*M)/N= 2*100/20=10. The total number of multiplexer switches needed for region 80 is thus 10*20 (LAB lines per LAB)*16 (No. of LABs)=3200.

In the embodiment of the present invention shown in FIG. 5, each multiplexer 310 also has a number of inputs equal to (K*M)/N*S=2*100/20*2=5. Although each multiplexer output goes to 2 different LABs on either side of the global conductor channel, two multiplexers areprovided for each such pair of LAB lines, so the number of multiplexers (310) doesn't change. This gives the number of multiplexers switches required as 320*5 (multiplexer 310 inputs)=1600. Thus, the number of switches required has been cut in half. However, a number of second-level multiplexers have been added. A total of 20 (No. of LAB lines per LAB)*16 (No. of LABs)=320 multiplexers have been added, each with 2 inputs, giving a total of 640 additional switches, for a grand total of 1600+640=2240, compared to 3200 of the prior art of FIG. 3, a savings of about ⅓. In an alternate embodiment, the additional 640 switches could be cut to 320 switches if a single switch were used for each second-level multiplexer 306, 306'. This would mean the input must be one line or the other, but could not be neither.

As can be seen, by using a single mux 310 to connect to both muxes 306 and 306', the number of muxes 310 is cut in half by the requirement that a single line go to both sides of the channel. When a global conductor 302 is connected to a mux, it will see less loading because each mux is smaller. The tradeoff is that if one signal uses a line 312 to go into the first LAB on line $O_T$, another signal going into that LAB must use another LAB line. Accordingly, with two input lines, there is essentially a 50% chance of a particular global conductor being able to get into a particular LAB if the first LAB line is already used.

The embodiment of FIG. 5 is thus believed to minimize the number of channel connections while retaining substantial flexibility in routing. Since a global conductor can get to two of the LAB lines, blockage of connections is kept to a manageable level.

Figure 6:
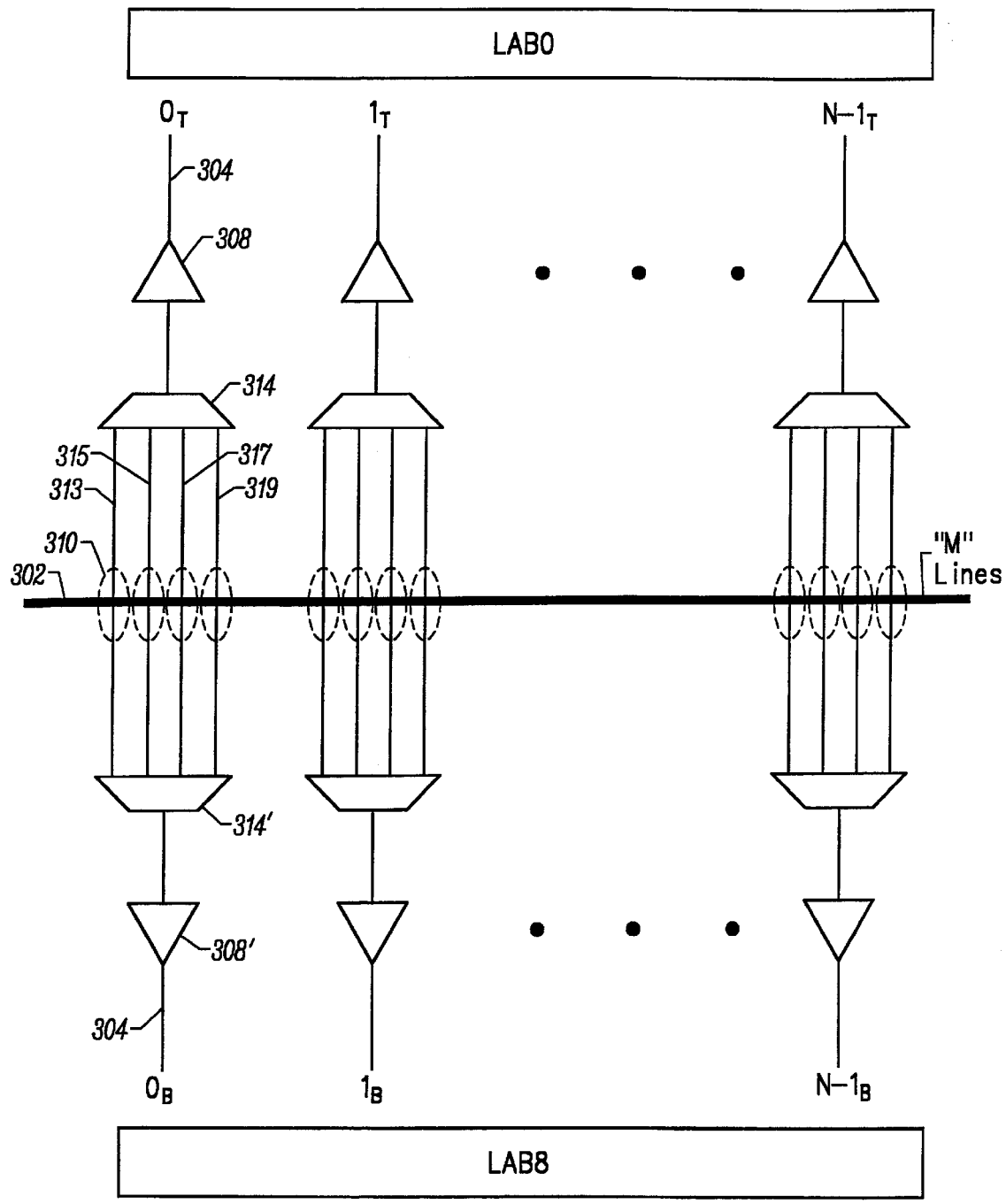
FIG. 6 is a diagram of a second embodiment of the multiplexer connections of the present invention using twice the number of multiplexer inputs.

FIG. 6 shows an alternate embodiment in which the number of multiplexer 314 inputs is doubled according to a formula which provides for the multiplexer 310 inputs to equal (M*2)/(N*4). This is with K=2 (the number of ways into the LAB from a particular global conductor) and S=4 (the number of ways first level multiplexer 310 is split into to feed multiplexer 314). As can be seen in FIG. 6, a multiplexer 314 has twice as many inputs for each LAB input line 304 as the embodiment of FIG. 5, resulting in twice as many multiplexers 310, but with each multiplexer 310 being half the size of the first level multiplexer 310 in FIG. 5.

The embodiment of FIG. 6 increases the possibility of a particular global conductor connecting to a particular LAB line, compared to the embodiment of FIG. 5. In FIG. 5, suppose line 312 is connected to a particular global conductor, and that multiplexer 306 is connected to line 312, to provide a path to LAB line $0_T$. Now suppose a connection to LAB line $0_B$ is desired. Line 312 as an input to multiplexer 306' can't be used, since the connection to line 312 from the global conductor multiplexer 310 has already been used. For another global conductor to connect to LAB line $O_B$, line 311 must be used.

In FIG. 6, on the other hand, if line 313 is already taken for a path to LAB line $0_T$, there are still 3 paths to LAB line $0_B$ through lines 315, 317 and 319. Thus, for FIG. 5, suppose a particular global conductor A is connected to one of the two multiplexers 310 which provide a connection to second-level multiplexers 306, 306' for LAB lines $0_T$ and $0_B$. If another global conductor B is assigned first to $0_T$, there is a 50% chance for global conductor A to still be able to connect to LAB line $0_B$, depending upon whether global conductor B used the same multiplexer 310 or not. In FIG. 6, on the other hand, with 4 multiplexers 310 to chose from, there is a 75% chance that the same multiplexer 310 won't be chosen by global conductor B, so that global conductor A will still be able to get in.

Figure 7:
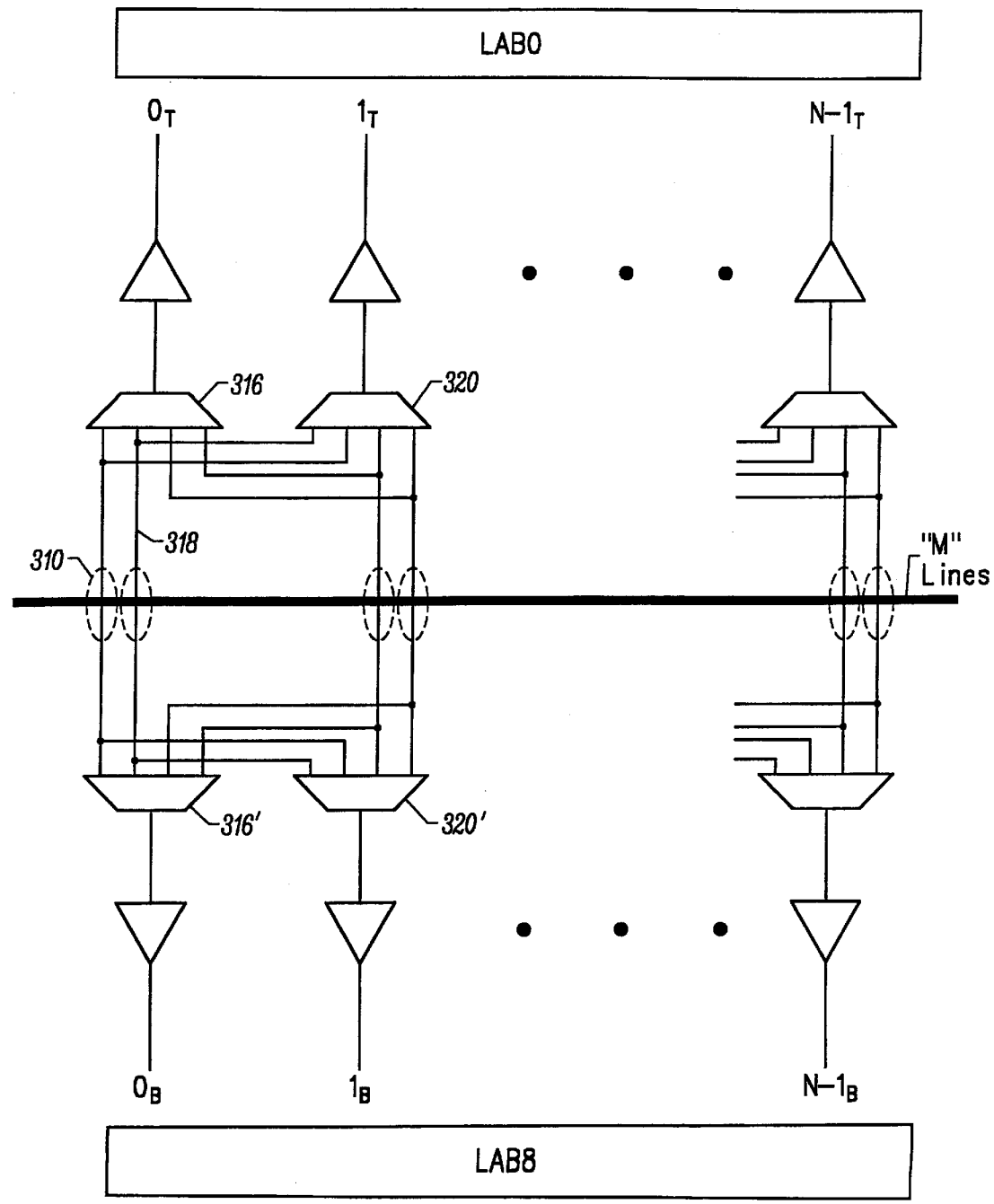
FIG. 7 is a diagram of the multiplexer connections of the present invention according to a third embodiment connecting to multiple LAB inputs on each side of the global connector array.

FIG. 7 shows essentially a mix of the embodiments of FIGS. 5 and 6 by providing the number of second-level multiplexer inputs as in FIG. 6, but by cutting the number of first-level multiplexers 310 in half by providing that each multiplexer 310 connects to two different multiplexers (316, 320) on each side, or four in total. Thus, the size and number of multiplexers 310 in FIG. 7 is the same as the size and number in FIG. 5, but there are twice as many possible connection paths from a global conductor to a particular LAB line. The embodiment of FIG. 7 thus provides more flexibility than the embodiment of FIG. 5, at a cost of more switches in the second-level multiplexers. A number of splits other than 4 could be used, with the limit case being as many splits as the number of M lines. However, such a limit case would eliminate the need for a mux 310 and would not provide the advantages of the invention.

In alternate embodiments, the multiplexers can be split into any number of pieces, with additional multiplexing added to the LAB to select to which multiplexer it wants to connect. Such a split multiplexing scheme can be modified further to allow more flexibility. In all embodiments a RAM bit is preferably used for each multiplexer to select the connection in a manner known to those of skill in the art.

As will be understood by those of skill in the art, the present invention may be embodied in other specific forms without departing from the spirit or essential characteristics thereof. Accordingly, the foregoing description is intended to be illustrative, but not limiting, of the scope of the invention which is set forth in the following claims.

What is claimed is:

1. A programmable logic device comprising:
    a plurality of global conductors;
    a plurality of logic array blocks, each of which has a plurality of inputs and at least one output, a first set of logic array blocks being on a first side of said global conductors, a second set of logic array blocks being on a second side of said global conductors;
    a plurality of multiplexers, each multiplexer having a plurality of inputs for coupling to different ones of said global conductors and an output coupled to one of said logic array block inputs;
    wherein a single connection connects one of said global conductors to both an input of a first multiplexer connected to a first logic array block in said first set, and an input of a second multiplexer connected to a first logic array block in said second set.

2. A digital system comprising a programmable logic device as set forth in claim 1.

3. The programmable logic device of claim 1 wherein there are M global conductors, N inputs to each of said first logic array blocks, and wherein said first and second multiplexers are second-level multiplexers, and further comprising a plurality of first-level multiplexers coupling said global conductors to said first and second-level multiplexers, each of said first-level multiplexers having (M*K)/(N*S) global conductor inputs, where S is the number of inputs into each second-level multiplexer, and K is the number ways into a logic array block from a given global conductor.

4. The programmable logic device of claim 3 wherein S=2, with two first level multiplexers connected to each second-level multiplexer.

5. The programmable logic device of claim 3 wherein S=4, with four first level multiplexers connected to each second-level multiplexer.

6. The programmable logic device of claim 5 wherein each of said first level multiplexers is a M/(N*2) input multiplexer.

7. The programmable logic device of claim 1 wherein said single connection also connects to an input of a third multiplexer connected to said first logic array block in said first set, and a fourth multiplexer connected to said first logic array block in said second set.

8. The programmable logic device of claim 7 wherein said first and third multiplexers are adjacent each other.

9. The programmable logic device of claim 1 further comprising a separate RAM bit control input coupled to each of said multiplexers.

10. The programmable logic device of claim 1 wherein said device is integrated on a single silicon chip.

11. A programmable logic device comprising:

a plurality of global conductors;

a plurality of logic array blocks, each of which has a plurality of inputs and at least one output, a first set of logic array blocks being on a first side of said global conductors, a second set of logic array blocks being on a second side of said global conductors;

a plurality of multiplexers, each multiplexer having a plurality of inputs for coupling to different ones of said global conductors and an output coupled to one of said logic array block inputs;

wherein a single connection connects one of said global conductors to both an input of a first multiplexer connected to a first logic array block in said first set, and an input of a second multiplexer connected to a first logic array block in said second set, said first and second logic array blocks being opposite each other;

wherein said single connection also connects to an input of a third multiplexer connected to said first logic array block in said first set, and a fourth multiplexer connected to said first logic array block in said second set; and a separate RAM bit control input coupled to each of said multiplexers.

12. A programmable logic device comprising:

a plurality of M global conductors;

a plurality of logic array blocks, each of which has a plurality of N inputs, a first set of logic array blocks being on a first side of said global conductors, a second set of logic array blocks being on a second side of said global conductors;

a plurality of first level multiplexers, each coupled to a set of said global conductors, each of said first level multiplexers having (M*K)/(N*S) global conductor inputs, where S is the number of first level multiplexers in a group, and K is the number ways into a logic array block from a given global conductor;

a plurality of second-level multiplexers, each second-level multiplexer having S inputs for coupling to one of said groups of first level multiplexers and an output coupled to one of said logic array block inputs;

wherein a single connection connects one of said global conductors to both an input of a first second-level multiplexer connected to a first logic array block in said first set, and an input of a second second-level multiplexer connected to a first logic array block in said second set, wherein said first logic array blocks are opposite each other.

13. The programmable logic device of claim 12 wherein S=2, with two first level multiplexers connected to each second-level multiplexer.

14. The programmable logic device of claim 12 wherein S=4, with four first level multiplexers connected to each second-level multiplexer.

15. The programmable logic device of claim 14 wherein each of said first level multiplexers is a M/(N*2) input multiplexer.

16. The programmable logic device of claim 12 wherein said single connection also connects to an input of a third multiplexer connected to said first logic array block in said first set, and a fourth multiplexer connected to said first logic array block in said second set.

17. The programmable logic device of claim 16 wherein said first and third multiplexers are adjacent each other.

18. The programmable logic device of claim 12 wherein said device is integrated on a single silicon chip.

19. A digital system comprising a programmable logic device as set forth in claim 12.

20. A method for programming a programmable logic device comprising:

providing a plurality of global conductors;

providing a plurality of logic array blocks, each of which has a plurality of inputs and at least one output, a first set of logic array blocks being on a first side of said global conductors, a second set of logic array blocks being on a second side of said global conductors;

providing a plurality of multiplexers, each multiplexer having a plurality of inputs for coupling to different ones of said global conductors and an output coupled to one of said logic array block inputs;

connecting, with a single connection, one of said global conductors to both an input of a first multiplexer connected to a first logic array block in said first set, and an input of a second multiplexer connected to a first logic array block in said second set.

21. The method of claim 20 wherein there are M global conductors, N inputs to each of said first logic array blocks, and wherein said first and second multiplexers are second-level multiplexers, and further comprising the step of providing a plurality of first level multiplexers coupling said global conductors to said first and second second-level multiplexers, each of said first-level multiplexers having (M*K)/(N*S) global conductor inputs, where S is the number of inputs into each second-level multiplexer, and K is the number ways into a logic array block from a given global conductor.

22. The method of claim 21 wherein S=2, with two first-level multiplexers connected to each second-level multiplexer.

23. The method of claim 21 wherein S=4, with four first-level multiplexers connected to each second-level multiplexer.

24. The method of claim 23 wherein each of said first level multiplexers is a M/(N*2) input multiplexer.

25. The method of claim 20 further comprising the step of connecting said single connection to an input of a third multiplexer connected to said first logic array block in said first set, and a fourth multiplexer connected to said first logic array block in said second set.

26. The method of claim 20 further comprising the step of programming a plurality of separate RAM bit control inputs coupled to said multiplexers.

* * * * *